United States Patent
Katagiri et al.

(10) Patent No.: US 7,144,298 B2
(45) Date of Patent: Dec. 5, 2006

(54) METHOD FOR MANUFACTURING SEMICONDUCTOR DEVICE AND APPARATUS FOR MANUFACTURING THEREOF

(75) Inventors: Souichi Katagiri, Kodaira (JP); Ui Yamaguchi, Saitama (JP)

(73) Assignee: Hitachi, Ltd., Tokyo (JP)

( * ) Notice: Subject to any disclaimer, the term of this patent is extended or adjusted under 35 U.S.C. 154(b) by 30 days.

(21) Appl. No.: 11/133,300

(22) Filed: May 20, 2005

(65) Prior Publication Data

US 2005/0221608 A1 Oct. 6, 2005

Related U.S. Application Data

(62) Division of application No. 10/457,369, filed on Jun. 10, 2003, now Pat. No. 6,908,860.

(30) Foreign Application Priority Data

Aug. 27, 2002 (JP) .............................. 2002-246343

(51) Int. Cl.
*B24B 49/00* (2006.01)

(52) U.S. Cl. .......................... 451/8; 451/287; 451/288; 205/642; 205/658

(58) Field of Classification Search ..................... 451/6, 451/8, 285, 287, 288, 104, 106, 113, 41; 438/689, 672, 697, 691, 692
See application file for complete search history.

(56) References Cited

U.S. PATENT DOCUMENTS

| | | | |
|---|---|---|---|
| 5,081,421 A * | 1/1992 | Miller et al. | 324/671 |
| 5,637,031 A * | 6/1997 | Chen | 451/41 |
| 5,985,093 A * | 11/1999 | Chen | 156/345.13 |
| 6,307,264 B1 * | 10/2001 | Fukumoto | 257/750 |
| 6,379,223 B1 | 4/2002 | Sun et al. | |
| 6,440,295 B1 | 8/2002 | Wang | |
| 6,472,314 B1 | 10/2002 | Catabay et al. | |

(Continued)

FOREIGN PATENT DOCUMENTS

JP 02-278822 11/1990

(Continued)

OTHER PUBLICATIONS

V. Koinkar, et al., "Chemical Mechanical Planarization of Copper Interconnects Using Fixed Abrasive Polishing Pad", CMP-MIC Conference, Mar. 2-3, 2000, pp. 58-65, USA.

*Primary Examiner*—Eileen P. Morgan
(74) *Attorney, Agent, or Firm*—Antonelli, Terry, Stout and Kraus, LLP.

(57) ABSTRACT

The object of the invention is to provide a method of manufacturing a semiconductor device and a processing apparatus for planarization wherein to form copper wiring in multiple layers. The removal of a residue of polishing by local electro polishing, the enhancement of the performance of planarization by using a grindstone and the reduction by small frictional force in electro polishing of damage, are enabled. To achieve the object, the following measures are taken. A residue of polishing of copper is removed by combining the detection of a local area including the residue of polishing of copper and local processing for electro polishing. As small-load processing for planarization is enabled by using electro polishing, multilayer interconnection structure using low-k material as a dielectric interlayer is also enabled. Plural pairs of small unit electrodes in a pair of which minus electrodes surround a plus electrode are provided to a tool for electro polishing, each electrode is connected to a power supply, pulse voltage is applied to each electrode and copper is electrolytically polished.

4 Claims, 9 Drawing Sheets

U.S. PATENT DOCUMENTS

| | | |
|---|---|---|
| 6,739,951 B1 | 5/2004 | Sun et al. |
| 6,739,953 B1 * | 5/2004 | Berman et al. ............... 451/41 |
| 6,743,645 B1 | 6/2004 | Kubota et al. |
| 6,811,658 B1 * | 11/2004 | Hongo et al. ............... 204/198 |

FOREIGN PATENT DOCUMENTS

| | | | |
|---|---|---|---|
| JP | 05052868 | * | 3/1993 |
| JP | 08-083780 | | 3/1996 |

* cited by examiner

→ REVOLUTION DIRECTION

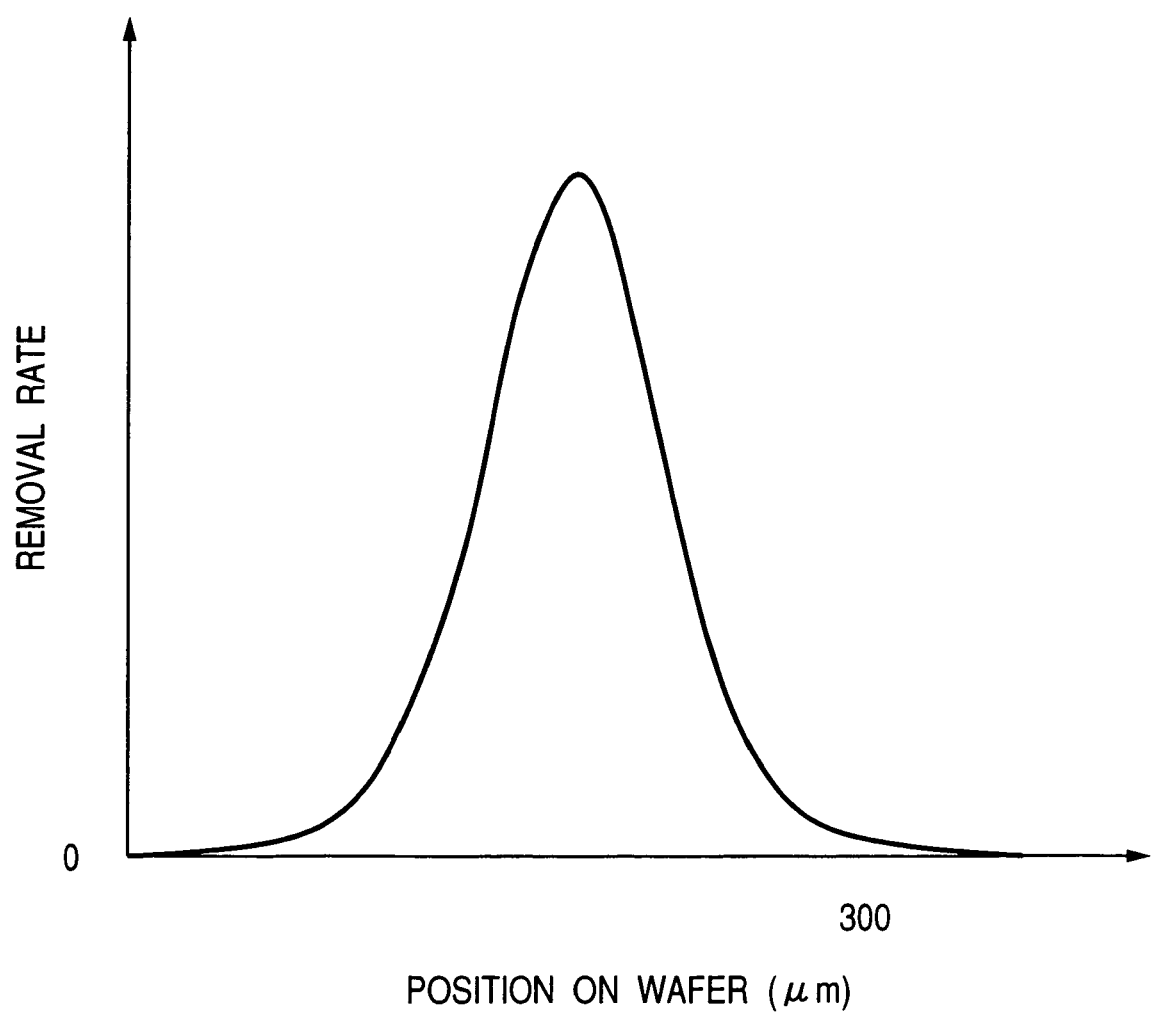

A—A CROSS SECTION

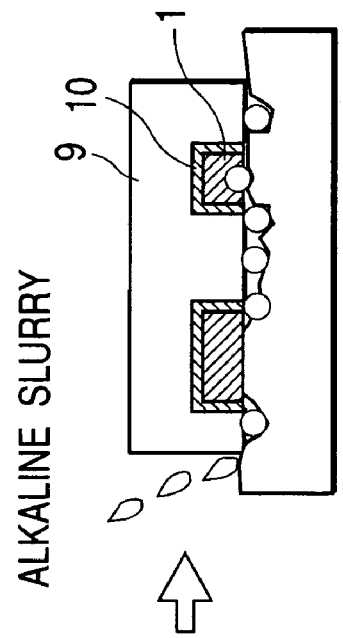
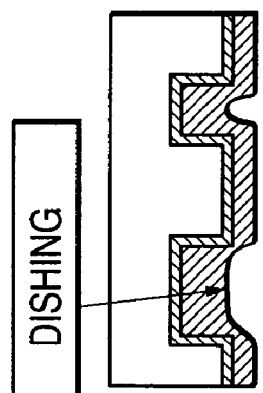
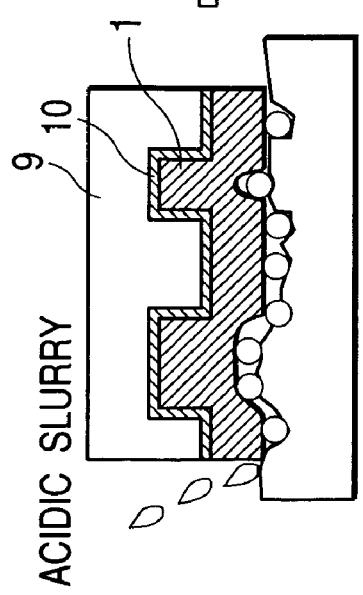
FIG. 9A  ACIDIC SLURRY
FIG. 9B  DISHING
FIG. 9C  ALKALINE SLURRY

METHOD FOR MANUFACTURING SEMICONDUCTOR DEVICE AND APPARATUS FOR MANUFACTURING THEREOF

This application is a Divisional application of prior application Ser. No. 10/457,369, filed Jun. 10, 2003, now U.S. Pat. No. 6,908,660 the contents of which are incorporated herein by reference in their entirety.

BACKGROUND OF THE INVENTION

1. Field of the Invention

The present invention relates to a method for manufacturing a semiconductor device, particularly relates to a method for manufacturing a semiconductor device and a manufacturing apparatus respectively suitable for forming reliable wiring on a semiconductor substrate using technique for polishing and grinding in a damascene wiring forming process.

2. Description of the Related Art

Recently, processing technique for planarization for shallow trench isolation (STI), forming a tungsten (W) plug for transmitting a signal from each transistor to an interconnection layer and forming the interconnection layer has been important for manufacturing a semiconductor integrated circuit.

For the processing technique for planarization, polishing processing technique called chemical mechanical-polishing (CMP) is representative.

Particularly, lately copper is used for wiring material. For planarization, a damascene process is mainstream and for example, is disclosed in Japanese Laid-Open No. 02-278822 and Japanese Laid-Open No. 08-83780.

In case copper is used for wiring material, there is a merit that the durability is enhanced and the resistance is reduced, compared with conventional type aluminum wiring, however, in the meantime, the failure of insulation due to a conductive ion by the diffusion of a copper ion into an oxide film is required to be considered.

In the damascene process, as shown in FIG. 9A, a barrier film 10 is formed as an interface between an oxide film 9 and copper 1 which is wiring material so as to prevent a copper ion from being diffused. In the damascene process, owing to the barrier film 10, the copper 1 is buried in a trench in a process from a step shown in FIG. 9A to a step shown in FIG. 9C.

For planarization by CMP, such processing that a dent (dishing) by overpolishing of a work piece and the whole dent (erosion) of a wiring assembled part are inhibited to obtain flat surface is required. Therefore, the elasticity of a polishing pad which is a processing tool is recently becoming harder.

Besides, as disclosed on pages 58 to 65 in proceedings of 2000 Chemical Mechanical Planarization for ULSI Multilevel Interconnection Conference, processing for planarization using fixed abrasive for high planarity and the inhibition of the use of abrasive is also executed.

Besides, the reduction of the resistance of wiring is enabled by the change of wiring material to copper, however, actual signal transmission speed is influenced by the dielectric constant of dielectric material (a dielectric interlayer) for isolating minute wiring. The narrow an interval between wiring is, the more remarkable the effect is and cannot be ignored.

In a device according to a rule of 0.18 μm, wiring is formed using the current silicon oxide film (dielectric constant: 4.1) as a dielectric interlayer, however, in a device according to a rule of 0.15 to 0.13 μm which will be massively produced, dielectric material (generally called low-k material) having a low dielectric constant of approximately 3.0 to 2.6 is required and in a device according to a rule of 0.1 μm or less, dielectric material having a lower dielectric constant of 2.5 or less is required.

For dielectric material having the dielectric constant of approximately 2.6, some candidates mainly of organic material can be given. However, there is a problem that the lower a dielectric constant is, the lower the mechanical strength of a film is. In a planarization process by CMP, the delamination and a crack of the film are easily caused and yield ratio is greatly deteriorated.

Particularly, the low-k material having the lower dielectric constant of 2.5 or less required for the rule of 0.1 μm or less is limited to brittle material such as porous silica, and it becomes a great problem in planarization.

Processing for planarization by CMP is executed by pressing a processed face on a pad and relatively rubbing the pad and a wafer, pouring polishing liquid including abrasive in a solvent. Therefore, machining frictional force which the processed face of the wafer receives during processing acts in the plane of the wafer to be a cause of the delamination or the breakage of a thin film on the surface. To avoid such a situation, low-k material that enables small-load polishing and has large mechanical strength is searched.

OBJECT AND SUMMARY OF THE INVENTION

In case CMP is used for planarization in the damascene process described above, there are some problems. One is a problem caused by using a pad having a high modulus of elasticity for means for realizing high planarity as described above. As the selectivity of a convex portion is enhanced when the pad having the high modulus of elasticity is used, a convex portion of a pattern formed on an ideally flat surface can be planarized at high selectivity.

However, an actual device uses a silicon wafer uneven in thickness for a base and in addition, is composed of a front end part including a transistor layer and a back end part including a multilayer interconnection layer. Therefore, when irregularities are made on each layer, a layer formed on the layers is formed in a plane having irregularities off an ideal flat surface.

When planarization is executed using a pad having a high modulus of elasticity in such a state, a problem that a residue of polishing is caused in a concave portion to be naturally polished except a pattern occurs. As such a residue of polishing caused in a damascene interconnection process causes a short circuit between wiring, the residue of polishing is a problem.

In addition, there is a problem that as the mechanical strength of the following film is 1/10 or less, compared with that of the current silicon oxide film and is remarkably deteriorated in case low-k material is used for dielectric material in a generation according to the rule of 0.1 μm or less, there is a problem that damage such as delamination and a crack is caused during processing by CMP.

Further, there is a problem that multiple interconnection layers are laminated in a device. In system LSI and logical LSI, the lamination of approximately seven to ten interconnection layers will be accelerated. As the combination of low-k dielectric material which is brittle material and multilayer interconnection structure is essential, a small-load processing method for planarization is more strongly desired.

Therefore, the object of the invention is to solve the problems, a first object is to provide a method for manufacturing a semiconductor device provided with reliable multilayer interconnection structure by polishing under a small load equivalent to the frictional force during machining of 1/10 or less of the conventional-type in a damascene wiring forming process, and a second object is to provide an apparatus for manufacturing a semiconductor device by a processing polishing technique for planarization that enables small-load polishing suitable when multilayer wiring is formed on a semiconductor substrate.

To achieve the objects, these inventors have conducted various experiments and have discussed about removing a residue of polishing that partially remained on the surface of a substrate except a wiring forming area when an upper interconnection layer is formed by using a damascene wiring forming process, furthermore, these inventors have conducted experiments and have discussed about processing polishing technique for planarization in which no excessive load is applied to a low-dielectric constant dielectric film forming a trench for burying wiring (the wiring forming area) when the surface of the substrate is polished.

As a result, two knowledge was acquired as follows. First knowledge is that small-load polishing in which machining frictional force is 1/10 or less, compared with the machining frictional force of the conventional CMP by using a processing apparatus for planarization provided with a predetermined electrolytic tool having an electrochemical machining function and a polishing function by a grindstone and an image detector when the interconnection film formed on the substrate except the trench for burying the wiring is removed by polishing. And second knowledge is that a residue of polishing of an interconnection film partially remaining except a trench for burying wiring metals on a substrate can be securely removed respectively by using same means of the first knowledge.

The invention is made based upon such important knowledge. In order to ensure burying wiring metal into trenches, the invention is characterized in that the position of an area including a residue of polishing of an interconnection film on a substrate can be detected by an image detector, the residue of polishing can be locally removed by a predetermined electrolytic tool provided with an electrochemical-machining function and a polishing function by a grindstone.

The outline of an example of the configuration of the predetermined electrolytic tool provided with the electrochemical machining function and the polishing function by the grindstone are following. Plural pairs of electrodes arrayed at a predetermined interval linearly or like a beehive are provided to a supporting body forming the electrolytic tool, and plural grindstones are provided to the supporting body at height protruded by 10 to 100 μm from the end of the electrode. It is desirable that the grindstone can be vertically moved and the height protruded from the end of the electrode (a gap between the height of the grindstone and that of the electrode) can be adjusted arbitrarily to some extent.

A pair of electrodes has structure that the other electrodes surround one electrode at a predetermined interval, each electrode is connected to a pulse power supply, and the voltage, the frequency and the waveform of a pulse can be controlled every an individual pair of electrodes, every block into which plural pairs of electrodes are divided or further in a mass including all pairs of electrodes.

Referring to schematic drawings shown in FIGS. 1, 2, 3A to 3B, the description of a principle when an upper interconnection layer is formed on a semiconductor substrate on which a semiconductor device is formed in a well-known method beforehand in a damascene wiring forming process according to the invention will be concretely described below.

FIG. 1 is a sectional view for explaining an example of representative configuration according to the invention and shows a process for forming an upper interconnection layer on the surface of a semiconductor wafer substrate (not shown) on which a semiconductor device is formed beforehand. That is, a film is formed on the semiconductor substrate by low-k dielectric material 9, a trench G for forming wiring is formed in the film and a metal barrier film 10 is formed in the trench and on the film. Copper 1 to be an upper interconnection layer is thinly formed on the metal barrier film 10 by sputtering, and the copper film that is formed on the thin copper film by electroplating, is planarized, and then the process for burying wiring metal in the trench G is finished.

Electrolytic solution 6 is filled on the processed face of the wafer substrate, and a plus electrode 2 and a minus electrode 3 are closely provided to a supporting body 25 forming a tool for electro polishing 11. In FIG. 1, a pair of electrodes that the plus electrode 2 is located in the center and the minus electrodes 3 surround the plus electrode are shown.

Distance between the electrode and the processed face of the wafer substrate can be adjusted by means not shown of the tool for electro polishing 11. Pulse voltage can be applied to the electrode from the power supply 4, and the degree of frequency and that of voltage can be controlled.

The electrodes can be relatively moved over the processed face in, directions horizontal and perpendicular to the surface of the substrate by driving means not shown and can be also positioned in an arbitrary position. In FIG. 1, only a pair of electrodes are shown, however, plural pairs may be also configured together as shown in a plan in FIG. 3A.

Further, a grindstone 7 that is provided on the supporting body 25 of the tool for electro polishing 11 separately from the electrodes, is touched to the processed surface of the wafer substrate to remove softened chelate material (a substance generated based upon the electrolytic solution 6 and the copper 1 by electrolytic action) 8 on the surface of the processed face.

The end face of the grindstone 7 is formed via a predetermined gap so that the end face is higher than each end of the electrodes 2, 3 and is also provided with a function for protecting the electrodes to prevent the electrodes from being directly touched to the processed face. The copper 1 is electrolytically polished by electrochemical reaction mainly between the electrodes 2, 3 and the electrolytic solution 6, the grindstone 7 rather wipes a substrate made of chelate material generated in an electrolytic process than mechanically grinding the substance and a load applied to the processed face is extremely small.

An image detector 5 is provided near to the electrodes and is provided with a function for detecting whether a residue of copper exists on the planarized surface of the substrate and a position where is the residue of copper. The image detector 5 may be also directly provided to the supporting body 25 of the tool for electro polishing 11, otherwise, as shown in FIG. 2, the image detector can be also provided independent of the tool for electro polishing 11.

When a residue of copper and its position of an area of the residue are detected on the processed face by the image detector 5, the residue can be clearly removed without any difficulty by using a specific pair 5 of electrodes or a block including pairs of electrodes of the tool for electro polishing 11.

BRIEF DESCRIPTION OF THE DRAWINGS

FIG. 4 is a graph for explaining the distribution of quantity processed by the tool for electro polishing according to the invention;

FIG. 9A is a sectional process drawing for explaining a damascene planarization process by conventional CMP technique and shows a state of the planarization of copper by first CMP, FIG. 9B shows a state in which the planarization of copper by first CMP is completed and FIG. 9C shows a state of the planarization of copper by second CMP.

DETAILED DESCRIPTION OF THE PREFERRED EMBODIMENTS

Figure 1:
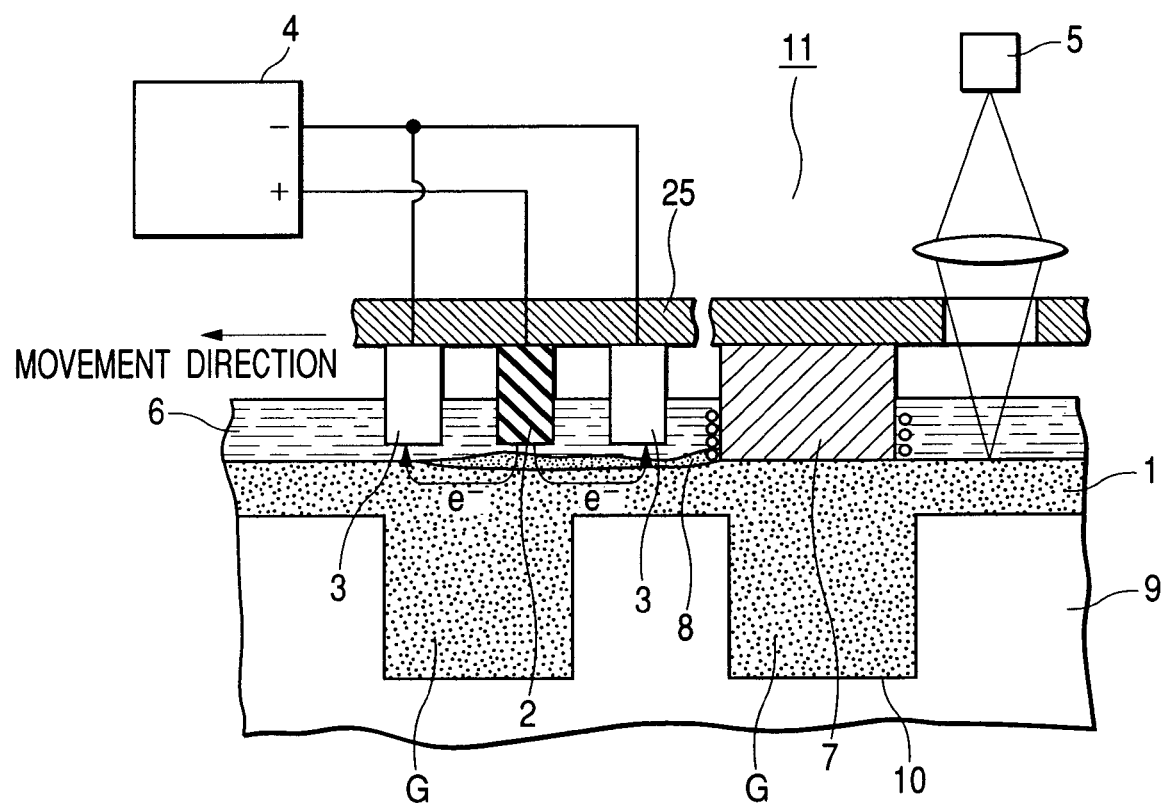
FIG. 1 is a schematic drawing for explaining a principle of processing for planarization of the invention.

The characteristics of the invention will be concretely described below.

A first embodiment of the invention is based upon a method for manufacturing a semiconductor device having:
 a process for providing the semiconductor device and a dielectric film on one surface of a semiconductor substrate beforehand, providing an opening to the dielectric film and sequentially forming an electric conductor plug connected to an electrode of the semiconductor device and
 a process for forming an upper interconnection layer connected to the electric conductor plug on the semiconductor substrate, wherein
 the process for forming the upper interconnection layer on the semiconductor substrate includes following four steps comprising:

first step for forming a low-dielectric constant dielectric film on the semiconductor substrate on which the electric conductor plug is formed,
 second step for forming an open trench for forming wiring in the low-dielectric constant dielectric film,
 third step forming a first conductive film to be a barrier layer in the open trench and on the surface of the low-dielectric constant dielectric film and forming a second conductive film to be an upper interconnection layer on the first conductive film and
 fourth step for removing a part of the second conductive film and a part of the first conductive film respectively formed on the semiconductor substrate by a processing apparatus for planarization provided with processing means for electro polishing and burying the first conductive film and the second conductive film in the open trench, and wherein
 the fourth step for removing a part of the second conductive film and a part of the first conductive film by the processing apparatus for planarization provided with the processing means for electro polishing includes
 a step for detecting a position of an area where a residue of polishing remaining except the open trench of at least the second conductive film by an image detector and
 a step for locally removing the residue of polishing based upon an image information detected by the image detector.

A second embodiment of the invention is characterized in that in the step for detecting the position of the area including the residue of polishing remaining except the open trench of at least the second conductive film and the step for locally removing the residue of polishing, an electrolytic tool of the processing apparatus, which is provided with the processing means for electro polishing, is equipped with a plus electrode and a minus electrode, and the electrodes of one pole surrounds the electrode of the other pole at a predetermined interval to form a pair of electrodes.

The diameter of a pair of electrodes provided to the electrolytic tool is 50 μm to 1 mm, desirably 100 to 500 μm. Plural pairs of electrodes each pair of which has such size are integrated as unit electrode in the electrolytic tool.

A third embodiment of the invention is characterized in that the processing apparatus for planarization provided with the processing means for electro polishing is provided with a composite tool in which the electrolytic tool and a polishing tool are combined. For the polishing tool, a grindstone or a polishing pad is used.

The method for manufacturing the semiconductor device is characterized in that positional relation between the polishing tool and the electrolytic tool is relatively changed from the same plane, and a step for changing the relative position of both tools during processing and executing processing for planarization is included.

The method for manufacturing the semiconductor device is characterized in that in a step for processing the second conductive film and the step for removing a residue of polishing of the second conductive film, the electrolytic tool is used and in a step for processing a part of the first conductive film, the tool is changed from the electrolytic tool to polishing tool.

The method for manufacturing the semiconductor device is characterized in that a step for cleaning a processed face using a soft pad is included.

The method for manufacturing the semiconductor device is characterized in that a step for that the second conductive film is processed by electrolytic solution for process liquid is included.

The method for manufacturing the semiconductor device is characterized in that the electrolytic solution includes oxidizer and anticorrosive.

The method for manufacturing the semiconductor device is characterized in that the oxidizer contains any one of hydrogen peroxide solution, phosphoric acid, lactic acid, malic acid, quinaldic acid, citric acid and tartaric acid and the anticorrosive contains benzotriazole.

A fourth embodiment of the invention relates to a processing apparatus for planarization suitable when the step for processing for planarization is executed particularly in the process for forming the upper interconnection layer on the semiconductor substrate in the method for manufacturing the semiconductor device.

The processing apparatus comprises:

- a platen (a plate table) for turning a semiconductor substrate, holding it,
- a tool for electro polishing for being touched to the semiconductor substrate held by the platen, being turned and electrolytically polishing the surface of the substrate,
- a power supply for applying voltage to an electrode provided to the tool for electro polishing,
- electrolytic solution supplying means for supplying electrolytic solution to the surface of the semiconductor substrate and
- an image detector that detects a polished state of the surface electrolytically polished of the semiconductor substrate, wherein:
- the tool for electro polishing is provided with a supporting body where plural pairs of unit electrodes a pair of which is formed by surrounding an electrode of one pole by electrodes of the other pole at a predetermined interval are provided and
- pulse voltage is applied from the power supply to the electrode.

Plural pairs of unit electrodes arrayed at a predetermined interval linearly or like a beehive are planted on the supporting body forming the tool for electro polishing, and plural grindstones whose height protrudes from the end of the electrode are provided to the supporting body. It is desirable that the grindstone can be vertically moved at a predetermined stroke.

Referring to the drawings, typical Examples of the invention will be concretely described below.

FIRST EXAMPLE

Referring to FIG. 1, a processing apparatus for planarization used for a method for manufacturing a semiconductor device according to the invention will be described below. In FIG. 1, a transistor is omitted from a silicon part of a wafer substrate, and a low-dielectric constant dielectric film (a low-k dielectric film) 9 for burying an upper interconnection layer, a barrier film 10 and copper 1 to be the upper interconnection layer are shown. The barrier film 10 is provided to prevent interconnection material (copper) from being diffused into the substrate and to secure adhesion between the substrate and the interconnection layer and for example, a thin film is formed with Ta or TaN.

A groove pattern G for forming interconnection is formed in the low-k dielectric film 9, and the barrier film 10 and the copper 1 are formed on the film. An initial shape of the surface of the substrate before a planarization process is irregular. In this state, the planarization process is executed until a convex part of the low-k dielectric film 9 is exposed, and the copper 1 is left in the groove G formed in the low-k dielectric film 9 and the planarization process is finished.

The invention provides a planarization processing method and a processing apparatus wherein the copper 1 on the surface of the substrate is processed, and then the copper is left in the groove G, and dishing and erosion is not arisen on the surface of the buried copper. In addition, friction force is hardly caused in processing and no residue of copper in polishing is made.

First, referring to FIGS. 1, 2, 3A and 3B, 4 and 5A to 5C, the planarization processing method and schematic structure of a planarization apparatus of a processed substrate 12 will be described.

For a processing principle, as shown in FIG. 1, first, electrolytic solution 6 is supplied to the surface of the copper 1. The electrolytic solution 6 is composed of pure water, an oxidizer and anticorrosive. The oxidizer mainly reacts to copper and generates a chelate compound 8.

The oxidizer may be also an organic acid such as a citric acid, a tartaric acid, a malic acid and a lactic acid or an inorganic acid such as a phosphoric acid or the combination of them. When hydrogen peroxide solution is applied to the acid, oxidation is accelerated and it is desirable.

For the anticorrosive, a coat by a surface active agent of benzotriazole (BTA) and high molecular organic aqueous solution, for example, may be also used.

For an example of such a surface active agent, polyacrylic ammonium can be given. Needless to say, another surface active agent may be also used.

The electrolytic solution 6 provides electric charge e to the copper 1 and generates the chelate compound (the chelate film) 8. To positively accelerate the supply of the charge, an electrode 2 and an electrode 3 are provided to a tool for electro polishing 11.

Figure 3A:
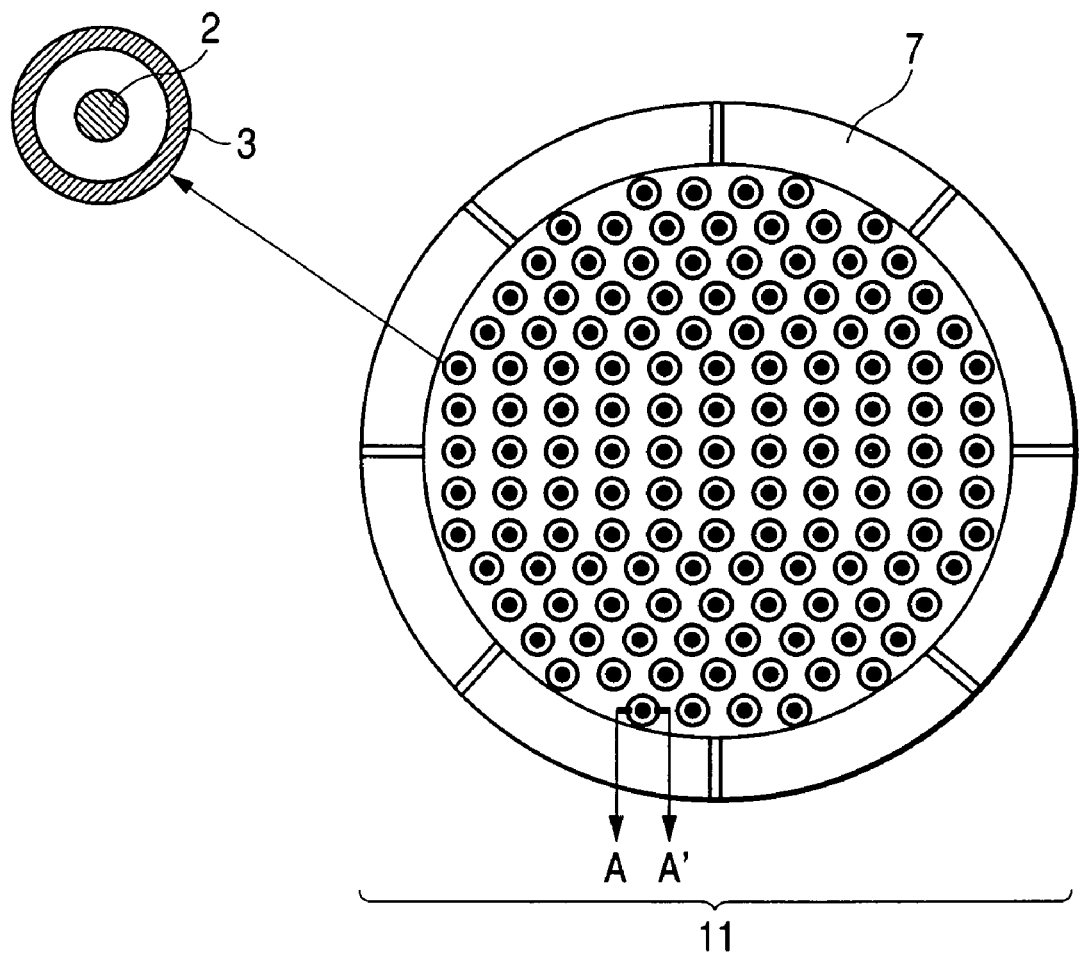
FIG. 3A is a plan for explaining one example of a tool for electro polishing according to the invention and FIG. 3B is a sectional view viewed along a line A–A' in FIG. 3A for explaining the example of the tool for electro polishing according to the invention.
Figure 3B:
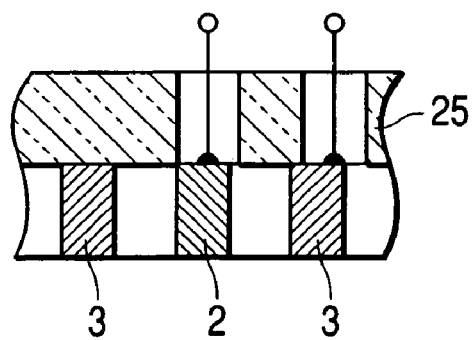

The electrode 3 is cylindrical and the outside diameter is 100 μm for example. The tool for electro polishing has concentric-circle structure that the minus electrode 3 having the thickness of 20 μm surrounds the plus electrode 2 having the diameter of 30 μm at a predetermined interval of 15 μm. Referring to FIGS. 3A and 3B, the details of the tool for electrolytic polishing 11 will be described later.

A power supply 4 is connected to these electrodes and can apply pulse voltage between the electrodes. The pulse voltage, its frequency and its waveform can be controlled by the power supply 4. In this example, the pulse voltage of 0 to 20 V, the frequency of 100 Hz and a rectangular waveform are used.

As electric charge is positively supplied to the copper 1 from the electrodes 2, 3 via the electrolytic solution 6 as described above, the chelate film 8 can be generated earlier than in a case that copper is merely dipped in electrolytic solution. As the chelate compound 8 is a soft substrate soluble in the electrolytic solution 6, it disappears from the surface of the substrate.

Further, to accelerate removing speed of the chelate film 8 from the surface of the substrate, means for softly wiping it has only to be, provided. To remove the chelate film 8 smoothly, a grindstone 7 is provided to a supporting body 25 of the tool for electro polishing 11. The height of the grindstone 7 provided to the supporting body 25 of the tool for electro polishing 11 is higher than that of the electrode, and the top of the grindstone 7 is protruded by a few tens to 100 μm. A load applied to the grindstone 7 may be 100 g/cm² or less and processing friction force required to remove the chelate film 8 can be one tenth or less than that of conventional type CMP.

Figure 5A:
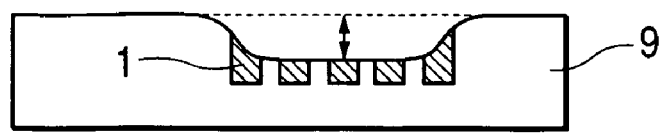
FIG. 5A is a sectional view showing a state after the planarization of a first layer is finished for explaining the overpolishing by planarization of an interconnection part in a process for forming multilayer wiring using conventional type technique.

Next, the residue of the copper 1 in polishing will be described. FIG. 5 show sectional structure in a process for forming conventional type multilayer interconnection. In a step shown in FIG. 5A, a state after a planarization process for a first layer is finished. When planarization is processed by using conventional type CMP, an interconnection part in which the copper 1 is buried, is polished too much as shown by an arrow, accordingly, dishing and erosion are arisen and a concave portion is formed.

Figure 5B:
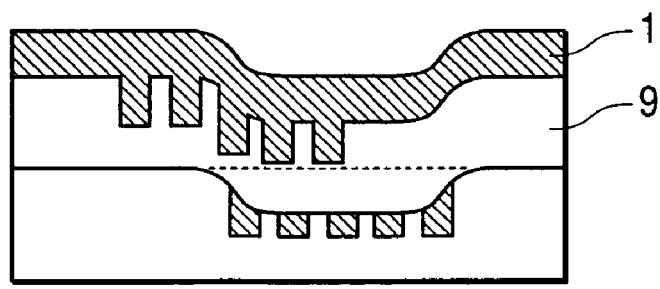
FIG. 5B is a sectional view showing a state in which a second layer of copper is formed in the process for forming the multilayer wiring using the conventional type technique.
Figure 5C:
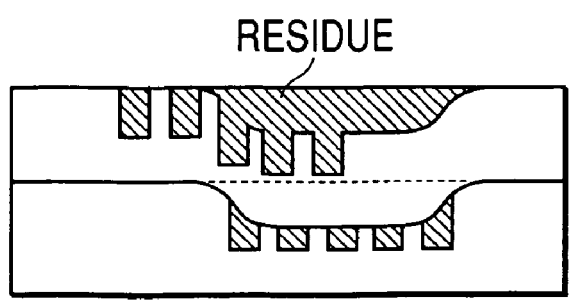
FIG. 5C is a sectional view showing a state after a step for planarizing the second layer is finished in the process for forming the multilayer wiring by using the conventional type technique.

A step shown in FIG. 5B shows a state in which copper 1 for a second layer is formed. As a further upper interconnection layer 1 is formed in addition to the concave portion formed in the preceding step as shown in FIG. 5B, a problem that the copper in the concave portion is left in a planarization process for the second layer in a step shown in FIG. 5C and short between adjacent wiring occurs.

Even if planarization is ideally accomplished, in case that a wafer has the unevenness in the thickness, the surface has the similar form and the residue of copper in polishing is arisen. To avoid this defect, overpolishing is normally executed, however, in that case, as caused by excessive polishing, the cross sectional area of wiring is reduced and the resistance of the wiring increases. It is not desirable. Therefore, as the residue of the copper 1 in polishing causes a short circuit in wiring, it can be said one of defects which should be avoided. The residue in polishing is distributed typically in a region having the width of a few mm to a few cm, and has a tendency to disperse on the surface of the wafer substrate.

A method and the means of solving the residue in polishing according to this example will be described below. FIG. 3 show the configuration of the tool for electro polishing 11. FIG. 3A is a plan and FIG. 3B is a sectional view viewed along a line A–A' in FIG. 3A. In the tool for electro polishing 11, plural pairs of plus and minus electrodes 2, 3, which are formed concentrically and one pair of which is regarded as a unit electrode, are integrated on the supporting body 25 in a beehive. An interval between adjacent unit electrodes is 50 μm in this example.

These unit electrodes are connected to the power supply 4, pulse voltage can be applied every unit electrode and electro polishing in a minute area is enabled using the unit electrode as a microprobe in principle. Therefore, if a predetermined unit electrode is selected so that the unit electrodes cover an area including a residue of polishing, pulse voltage is applied and electro polishing is executed when the area including the residue of polishing, and position of the residues are detected by an image detector 5, even a residue of polishing in a minute area can be easily removed without omission.

A pair of unit electrode has the diameter of from 50 μm to 1 mm or 100 to 500 μm, and the diameter of the whole tool for electro polishing 11 is approximately 5 to 10 cm. The tool for electro polishing 11 is circular and the grindstone 7 divided in an arc is provided to the outside.

A profile of a removal rate per one set of electrode is like Gaussian distribution as shown in a graph in FIG. 4, when the diameter of the outer electrode is 100 μm, the width of the profile is 300 μm and half band width is approximately 100 μm. Local polishing is enabled by allocating the distribution to an area including a residue of polishing suitably.

Figure 2:
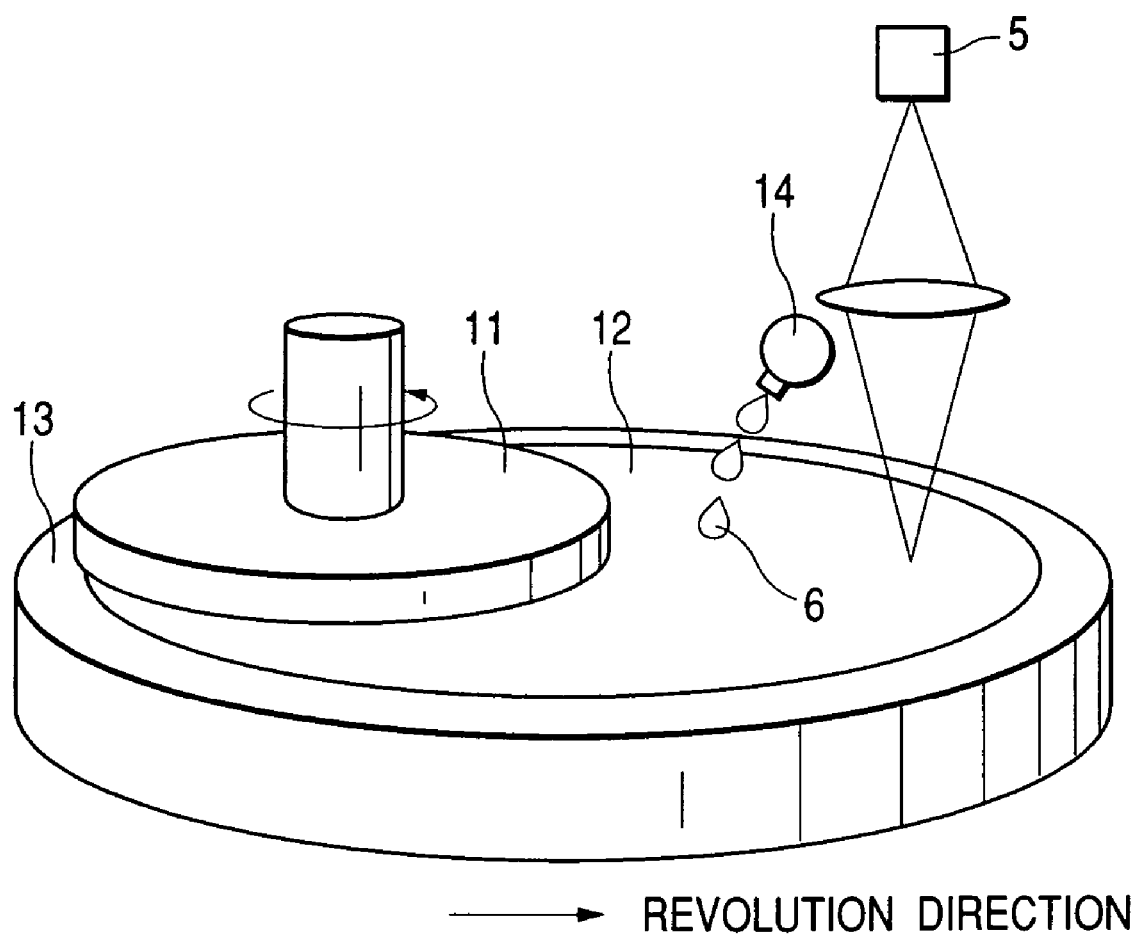
FIG. 2 is a schematic drawing for explaining the configuration of a processing apparatus for planarization according to the invention.

FIG. 2 is a perspective view schematically showing an example of the concrete configuration of the processing apparatus for planarization according to the invention. A wafer 12 is set on a platen 13 which is a rotary table and the rotation is held. The tool for electro polishing 11 is located on the wafer 12 and is pressed on the wafer, being rotated. The electrolytic solution 6 is supplied onto the wafer 12 from a nozzle for supplying electrolytic solution 14.

In addition, the image detector 5 is provided in a position in which the image detector does not interfere with the tool for electro polishing 11. The image detector 5 can detect whether a residue of polishing exists on the whole wafer 5 or not, its position and the size if it exists. In this embodiment, immediately before finishing the planarization of copper forming the upper interconnection layer, the position and the size of a residue of copper in polishing are detected using the image detector 5. Though the following function is not shown, a function for detecting the position of an area including a residue of polishing on the wafer is also provided to this apparatus.

The detected residue of polishing is effectively removed using a specific pair or a few pairs of electrodes out of plural electrodes of the tool for electro polishing 11. At this time, the grindstone 7 is backed upward and only the corresponding residue of polishing is removed by electro polishing without removing the chelate layer 8 by the grindstone 7. Though means for backing the grindstone 7 is not shown, the grindstone 7 can be vertically positioned, compared with the height of the electrode.

When predetermined processing is finished as described above, The residue is detected using the image detector 5 again whether the corresponding residue of polishing is solved or not. In case a residue of polishing is still detected, removal is repeated and is continued until all residues of polishing are removed. It is known that planarization with small frictional force which was impossible heretofore is enabled without a residue of polishing by using such local electro polishing.

On the planarization process for forming damascene interconnection, as material which can be processed in this embodiment is limited to copper, a process for removing the barrier film 10 is left. Therefore, the process for removing the barrier film 10 is required after the process described in this embodiment. To remove the barrier film 10, for example, electrolytic solution is changed so that it has composition that can selectively remove the barrier film by electro polishing. Or the barrier film 10 may be also removed by mechanical polishing using a conventional type polishing pad using an abrasive grain or a grindstone.

SECOND EXAMPLE

Next, referring to FIG. 6, an example in which the invention is applied to a processing apparatus for planarization provided with multiple platens will be described. A first platen 13-1 is composed of a grindstone 7, a linear electrolytic tool 18 and a linear image detector 19.

In the linear electrolytic tool 18, electrodes having the same structure as the unit of electrodes shown in FIGS. 3A and 3B concerning the first example, are linearly arrayed and also linearly arrayed the linear image detector 19, which are solid-state image sensing devices (CCDs).

A processing principle is similar to that in the first example, however, this example is different from the first example in that a polishing tool is larger than a wafer. The processing apparatus for planarization provided with the multiple platens in this example, has the similar structure to a so-called rotary CMP machine.

Figure 7A:
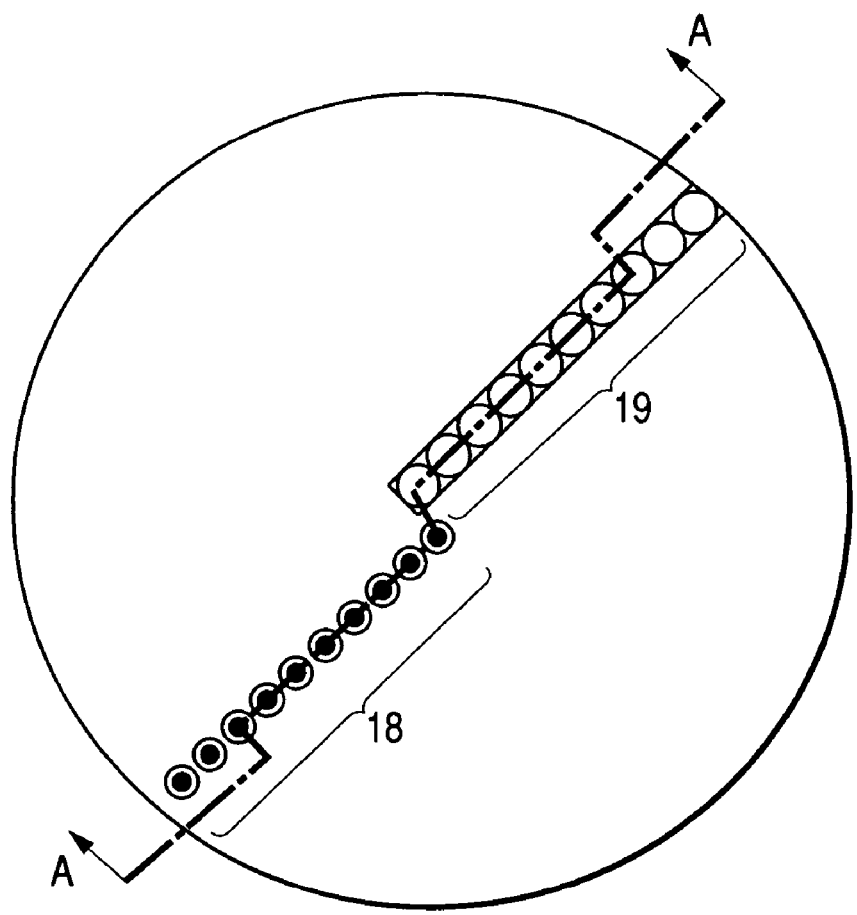
FIG. 7A is a plan for explaining an example of the configuration of a tool for electro polishing shown in FIG. 6.
Figure 7B:
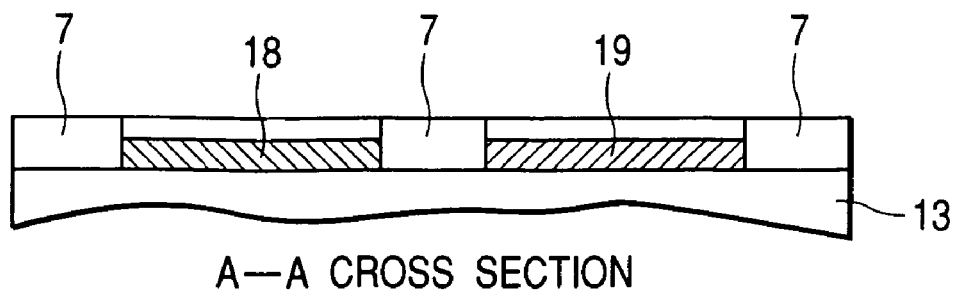
FIG. 7B is a sectional view viewed along a line A—A in FIG. 7A that shows the tool for electro polishing shown in FIG. 7A.

The processing apparatus for planarization in this embodiment is different from the rotary CMP machine in that the structure of the tool is different from the polishing pad of the conventional type as shown in FIG. 7. The tool has unique structure for this example. FIG. 7A is a plan showing the platen 13-1 and a second platen 13-2 and FIG. 7B is a sectional view viewed along a line A—A in FIG. 7A.

Structure that the grindstone 7 is installed on the platen 13, the linear electrolytic tool 18 is linearly arranged on a radius and the linear image detector 19 is arranged on an another radius as shown in FIG. 7. The platen 13-1 and the second platen 13-2 have the similar structure. The linear electrolytic tool 18 is basically the same as the tool for electro polishing in the first embodiment shown in FIGS. 1, 3A and 3B, though the linear electrolytic tool is different in the array of electrodes.

A third platen 13-3 is made of a normal polishing pad or a grindstone. A soft pad is mounted on the last fourth platen 13-4.

Figure 6:
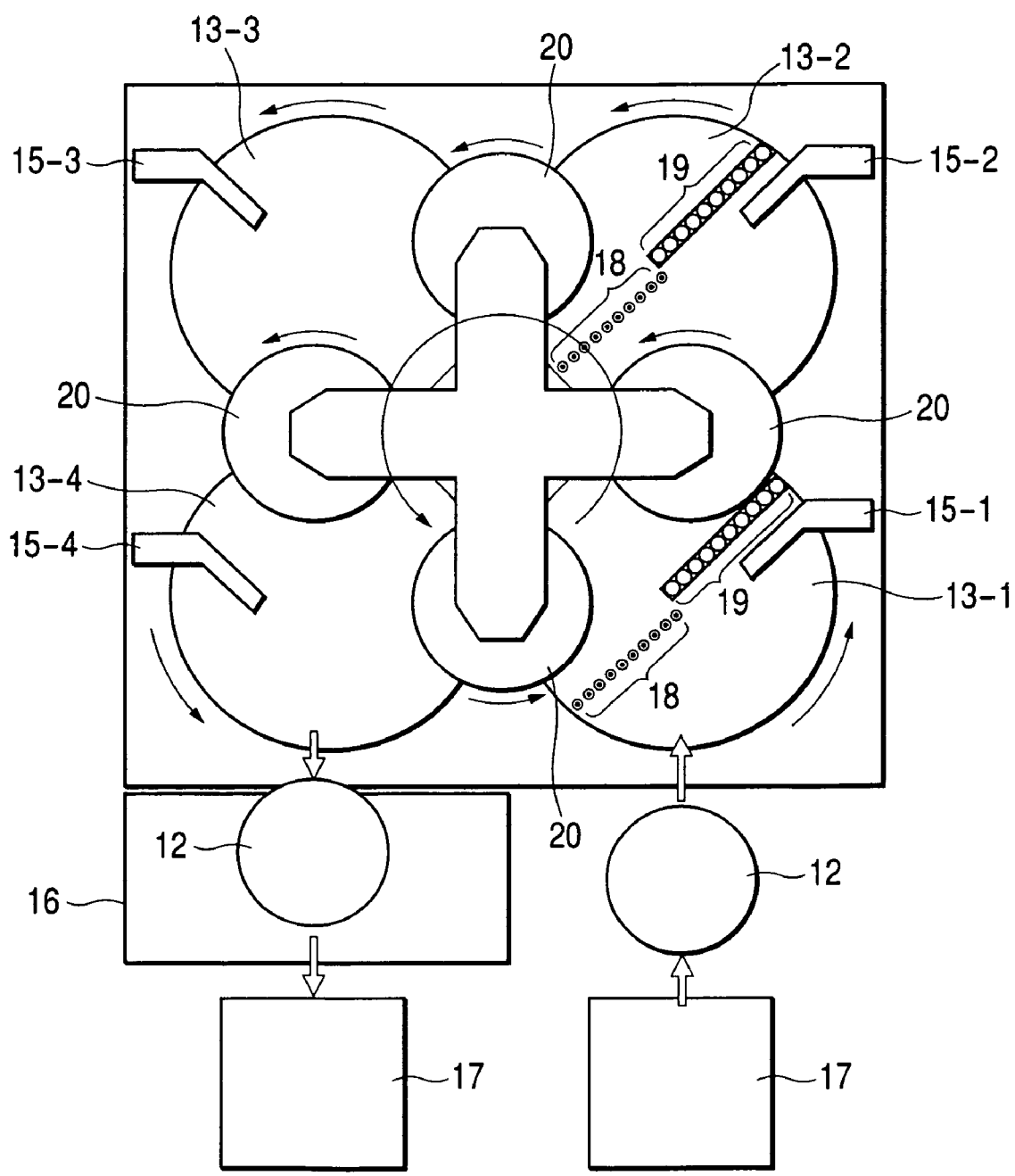
FIG. 6 explains another example of the configuration of the processing apparatus for planarization according to the invention.

As shown in FIG. 6, a process-liquid-supplying nozzle 15 is provided to each platen and required solution is supplied at a required flow rate. The electro polishing of copper is enabled by such configuration as in the first embodiment.

Next, relationship between a processing process for planarizing copper damascene wiring and the apparatus equivalent to this example will be described. After a wafer 12 that leaves a wafer cassette 17 is chucked by a wafer carrier 20 with the top surface of the wafer directed downward, it is loaded onto the first platen 13-1. Electro polishing liquid 6 is supplied onto the first platen from the process liquid supplying nozzle 15 as in the first example.

The electro polishing liquid includes any of phosphoric acid, lactic acid, malic acid, BTA, hydrogen peroxide solution, polyacrylic ammonium and pure water or the combination of these. The electro polishing liquid may also include other organic acid such as citric acid, tartaric acid and quinaldic acid.

In the electro polishing liquid including any or the combination of these, the copper film formed face of the wafer 12 is pressed upon the tool at a load of 100 g/cm$^2$ or less and is processed. The rotational speed of the platen is set to approximately 30 to 100 rpm and the rotating velocity of the wafer carrier 20 is also set to approximately 30 to 100 rpm.

On the first platen 13-1, the wafer is processed, applying voltage of a pulse waveform to the electrodes of the linear electrolytic tool 18 and the linear image detector 19 minutely detects whether a residue of polishing of copper exists or not. In this process, a polishing rate of copper is adjusted so that a throughput is enhanced. When a state in which copper is locally removed, is detected by the linear image detector 19, polishing is finished and the wafer is moved onto the second platen 13-2.

On the second platen 13-2, a position including a residue of copper is detected by the linear image detector 19, pulse voltage is applied to only required electrodes in synchronization with time at which an area including the residue of polishing passes over each electrode of the linear electrolytic tool 18 and then, the residue of polishing is removed. When the removal of the residue of copper is detected by the linear image detector 19, polishing on the second platen 13-2 is finished and the wafer is moved onto the third platen 13-3.

On the third platen 13-3, the exposed barrier film 10 is removed. Conventional type CMP for removing a barrier film has only to be executed. However, polishing under a small load of 100 g/cm$^2$ or less is required to be executed. When the removal of the barrier film 10 is finished, the surface of the wafer is cleaned on the fourth platen 13-4.

The soft pad is mounted on the fourth platen 13-4, and foreign materials which adhere to the surface of the wafer can be removed without damaging the surface. Cleaning on the fourth platen 13-4 may be also omitted because post cleaning is made after processing.

The wafer 12 which is finished the polishing is loaded onto post cleaning means 16, is housed in the wafer cassette 17 in a dry state after cleaning and processing for planarization is completed.

A normal polishing pad may be also used in place of the grindstone 7 installed on the first and second platens. Selection to which the balance of the whole polishing performance including planarizing performance is considered, is required.

THIRD EXAMPLE

Figure 8:
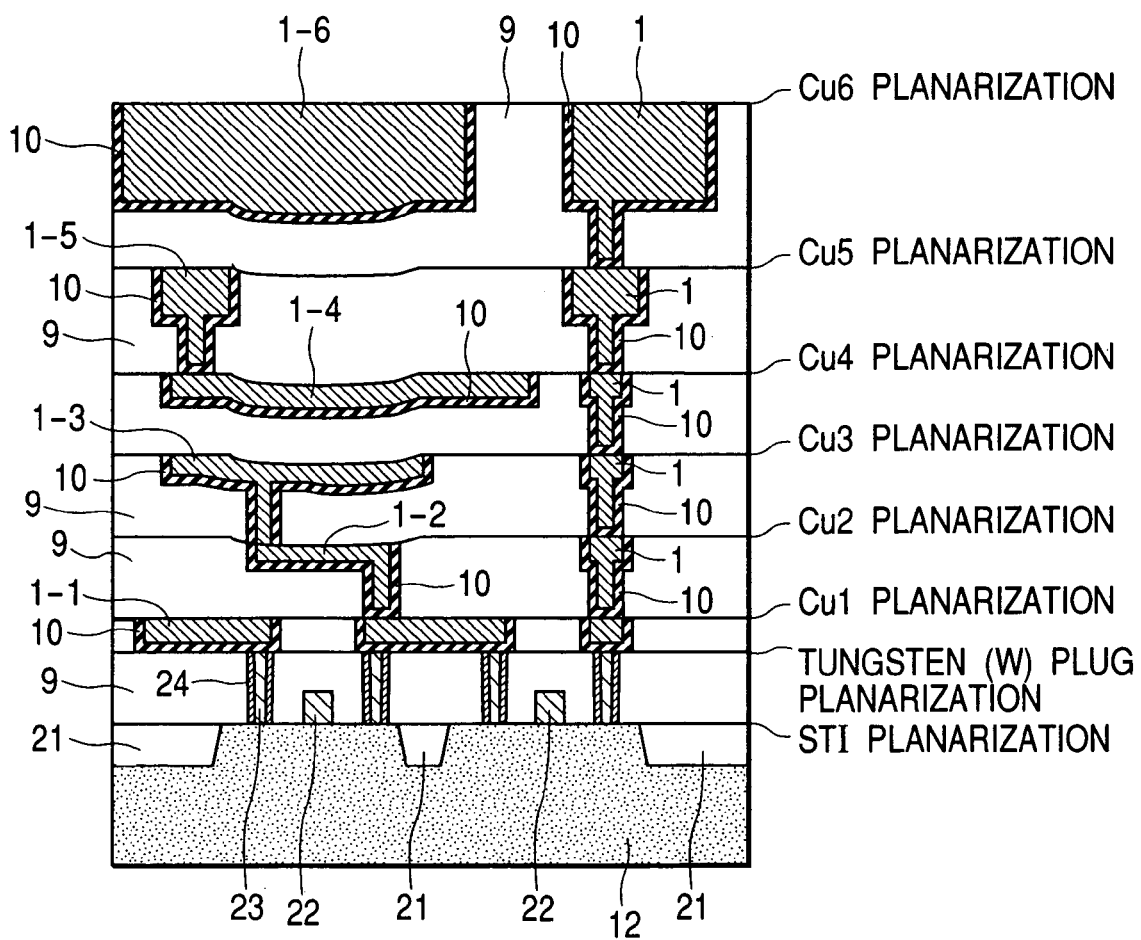
FIG. 8 explains the sectional structure of a semiconductor device provided with multilayer interconnection structure manufactured according to the invention.

FIG. 8 is a sectional view showing multilayer interconnection structure formed on a semiconductor substrate as an upper interconnection layer using processing technique for planarization according to the invention. That is, FIG. 8 shows a section of a multilayer interconnection logic device composed of six layers.

After a shallow trench is formed on the surface of a silicon wafer substrate 12 and an oxide film 21 is formed in the trench to construct a shallow trench isolation (STL) by processing technique for planarization, a gate pattern 22 is formed, and then, a transistor is formed. Afterward, a contact plug 23 made of tungsten (W) with an upper interconnection layer is formed by processing technique for planarizing W. A barrier film 24 is formed on an interface between the W plug 23 and a dielectric film 9 as in the copper interconnection structure. Layers on/over the W plug 23 are all a copper interconnection layer and these six interconnection layers 1-1 to 1-6 are formed according to the invention.

An example in case the reduction in thickness of the second copper interconnection layer 1-2 is caused in a process except planarization will be described below. For an example in which irregularities are caused in addition to the reduction in thickness of copper, there is the thermic deformation of the dielectric film 9 made of low-k material. In case irregularities are caused, the upper interconnection layers 1-3 to 1-6 over the second copper interconnection layer 1-2 are kept concave by the effect of a concave portion.

When the conventional type processing technique for planarization is applied to the formation of these upper interconnection layers, a problem that causes a failure of wiring is caused by the occurrence of a residue of polishing of copper, however, for the shape of the third to sixth copper interconnection layers shown in FIG. 8, copper wiring of predetermined quantity can be formed along a concave shape as shown in the interconnection layers 1-3 to 1-6 by detecting a local residue of polishing and removing local copper in the corresponding area by electrochemical machining according to the invention.

As stress upon the processed substrate is approximately zero in electro polishing according to the invention, the low-k dielectric film 9 is not damaged by machining frictional force. Therefore, no delamination and no crack of the interconnection layer are arisen.

Particularly, in the device having multilayer interconnection structure shown in FIG. 8, the number of interlayers is increased and a device having approximately 10 to 20 interlayers is predictable. As particularly upper wiring of these wiring is deep and thick, a problem of the delamination of a lower layer in which minute interconnection patterns are crowded occurs, however, according to the invention, as machining frictional force can be remarkably reduced, the device having multilayer wiring shown in FIG. 8 can be manufactured without a defect.

As described in detail above, the predetermined objects can be achieved by the invention. That is, the copper damascene interconnection layer can be planarized without overpolishing which has been heretofore executed to remove a residue of polishing. Besides, frictional force during machining can be also reduced down to $\frac{1}{10}$ or less of that of the conventional type.

Therefore, large effect that the device in which no increase of the resistance of wiring is caused and dispersion in resistance between wiring is small can be produced, reducing a fault rate can be acquired. Further, an interconnection layer can be formed using new low-k material which is brittle material the mechanical strength of which is low for a dielectric interlayer.

What is claimed is:

1. A processing apparatus for planarization, comprising:
    a platen for rotating a semiconductor substrate, the platen being capable of holding the semiconductor substrate,
    a tool for contacting the semiconductor substrate and for electropolishing the surface of the substrate,
    a power supply for applying voltage to an electrode provided to the tool for electropolishing,
    an electrolytic solution supplying means for supplying electrolytic solution to the semiconductor substrate, and
    an image detector for detecting a polished state of the electropolished surface of the semiconductor substrate, wherein:
    said tool for electropolishing comprises:
    a plurality of electrode units, each electrode unit including a positive electrode and a negative electrode, to which positive voltage and negative voltage are applied respectively; and
    a supporting body by which the plurality of electrode units is supported,
    wherein the positive electrode is surrounded by the negative electrode, and
    wherein pulse voltage is applied to the electrodes from the power supply.

2. A processing apparatus for planarization according to claim 1, wherein:
    the plurality of electrode units are arrayed linearly or at a predetermined interval on the supporting body forming the tool for electropolishing; and
    plural grindstones having a height protruding beyond the end of the electrodes are provided to the supporting body.

3. A processing apparatus for planarization according to claim 1, wherein said plurality of electrode units are arranged in a honeycomb configuration on the supporting body.

4. A processing apparatus for planarization according to claim 1, wherein said power supply applies the positive voltage to the positive electrode and the negative voltage to the negative electrode, of each electrode unit of the plurality of electrode units.

* * * * *